United States Patent
Krämer et al.

(10) Patent No.: US 11,874,306 B2
(45) Date of Patent: Jan. 16, 2024

(54) FIELD DEVICE WITH MONITOR AND METHOD OF OPERATION

(71) Applicant: VEGA GRIESHABER KG, Wolfach (DE)

(72) Inventors: Florian Krämer, Mühlenbach (DE); Patrick Heizmann, Oberwolfach (DE)

(73) Assignee: VEGA GRIESHABER KG, Wolfach (DE)

( * ) Notice: Subject to any disclaimer, the term of this patent is extended or adjusted under 35 U.S.C. 154(b) by 388 days.

(21) Appl. No.: 16/797,196

(22) Filed: Feb. 21, 2020

(65) Prior Publication Data
US 2020/0300899 A1    Sep. 24, 2020

(30) Foreign Application Priority Data
Mar. 22, 2019 (DE) .................... 10 2019 107 399.5

(51) Int. Cl.
 G01R 31/52    (2020.01)
 G01R 19/165   (2006.01)
 H05K 9/00     (2006.01)

(52) U.S. Cl.
CPC ....... *G01R 19/16571* (2013.01); *G01R 31/52* (2020.01); *H05K 9/0007* (2013.01); *H05K 9/0064* (2013.01)

(58) Field of Classification Search
CPC . G01R 31/52; G01R 19/16571; H05K 7/1464
See application file for complete search history.

(56) References Cited

U.S. PATENT DOCUMENTS

| | | | |
|---|---|---|---|
| 6,343,498 B1* | 2/2002 | Oba | G01D 3/08 73/1.57 |
| 2010/0007354 A1* | 1/2010 | Deaver, Sr. | G01R 31/52 324/539 |
| 2015/0168475 A1* | 6/2015 | Kalberer | G01R 31/3277 324/538 |
| 2016/0372912 A1* | 12/2016 | Barker | F03D 7/048 |
| 2017/0138991 A1* | 5/2017 | Curtis | G01R 31/52 |
| 2017/0350942 A1* | 12/2017 | Kinsella | G01R 31/52 |
| 2018/0045767 A1* | 2/2018 | Daigle | G01R 35/00 |
| 2018/0203054 A1* | 7/2018 | Romero | G01R 31/007 |
| 2019/0049489 A1* | 2/2019 | Fleege | G11C 7/062 |
| 2019/0329731 A1* | 10/2019 | Davis | H04W 4/023 |
| 2020/0200832 A1* | 6/2020 | Takeuchi | G01R 19/16528 |

FOREIGN PATENT DOCUMENTS

DE    196 01 880 A1    1/1996

OTHER PUBLICATIONS

GPTO office action for related German application 10 2019 107 399.5 dated Nov. 29, 2019.

\* cited by examiner

*Primary Examiner* — Jeff W Natalini
(74) *Attorney, Agent, or Firm* — William Gray Mitchell

(57) ABSTRACT

A field device having a monitoring device for grounding and/or shield connections, wherein the monitoring device is connected to a power supply of the field device, an activation arrangement for activating a monitoring current and at least one current detection device downstream of the activation arrangement, wherein the at least one current detection device is connected to at least one component of the field device to be grounded and/or to be shielded.

7 Claims, 2 Drawing Sheets

FIELD DEVICE WITH MONITOR AND METHOD OF OPERATION

CROSS REFERENCE TO RELATED APPLICATIONS

This patent application claims priority to German Patent Application 102019107399.5, filed on Mar. 22, 2019.

STATEMENT REGARDING FEDERALLY SPONSORED RESEARCH OR DEVELOPMENT

No federal government funds were used in researching or developing this invention.

NAMES OF PARTIES TO A JOINT RESEARCH AGREEMENT

Not applicable.

SEQUENCE LISTING INCLUDED AND INCORPORATED BY REFERENCE HEREIN

Not applicable.

BACKGROUND

Field of the Invention

The invention is a field device with monitor and method of operation

Background of the Invention

Field devices are known from the prior art for use in process automation. The applicant distributes such field devices for example to measure fill levels, limit levels, and pressure. Due to the further development of the underlying measurement technology and reduced manufacturing costs, such field devices are also interesting for other areas of application of automation technology.

The term automation technology refers to a segment of technology that includes all measures for operating machinery and systems without human interaction. The process automation segment can then be understood as the lowest degree of automation. The goal of process automation is to automate the interaction between individual components of a production facility in the areas of chemistry, petroleum, paper, cement, maritime navigation, or mining. A variety of sensors are known for this. These are adapted in particular to the specific requirements of the process industry, such as mechanical stability, insensitivity to contamination, extreme temperatures, and extreme pressures. Measured values of these sensors are usually transmitted to a control room, where process parameters such as fill level, flow rate, pressure, or density are monitored and settings for the entire production system can be changed manually or automatically.

Another field of automation technology concerns logistics automation. Distance and angle sensors are used to automate workflows in the area of logistics automation in a building or in a single logistics system. Typical applications include systems for logistics automation in the area of baggage and cargo processing at airports, in the traffic surveillance field (toll systems), in retail, package distribution, or in the area of building security (physical access control).

The examples listed above have in common that the respective application requires presence detection in combination with an exact measurement of the size and position of an object. Radar systems of the prior art have not yet been able to meet these requirements, which is the reason why different sensors are currently applied on the basis of optical measurement methods using laser, LED, 2D cameras or 3D cameras, which measure distances according to the time of flight (ToF) principle.

A third area of automation technology concerns factory automation. Applications can be found in most various fields, such as automobile manufacturing, food manufacturing, pharmaceutical industry, or generally in the packaging area. The goal of factory automation is to automate the production of goods by machines, production lines, and/or robots, i.e. to allow operation without human interaction. The sensors used here and the specific requirements with regard to the measurement accuracy when recording the position and size of an object are comparable with those in the example of logistics automation stated above. Usually, sensors based on optical measurement methods are also widely used in the area of factory automation.

Optical sensors have dominated so far both in the area of logistics automation as well as in the area of factory automation and safety technology. They are fast and affordable, and can reliably determine the position and/or distance from an object due to the relatively easy ability to focus optical radiation underlying the measurement. However, a significant disadvantage of optical sensors is their increased maintenance requirement, as in the previously listed areas, after several thousand operating hours, when soiling of the sensors can be observed, which severely impairs the measurement. In addition, the measurement can be impaired by oil vapors or other aerosols with fog formation especially when used in production lines and then lead to an additional contamination of optical sensors.

In automation technology, the connection of a shield and/or a ground connection of the field devices has high importance with regard to process stability and/or safety. EMC interference caused by faulty or omitted shielding connections can influence or even interrupt a process. An omitted ground connection can lead to an electrical accident in case of an error.

It is the task of the present invention to continue to form known field devices to achieve higher process reliability and/or accident safety.

This task is solved with a field device having the features of claim 1 and with a method for operating such a field device having the features of claim 7. Advantageous further embodiments are the objective of the dependent claims.

BRIEF SUMMARY OF THE INVENTION

In a preferred embodiment, a field device (1) with a monitoring device (3) for grounding and/or shield connections, wherein the monitoring device (3) is connected to a power supply (5) of the field device (1), and has an activation arrangement (7) for activating a monitoring current ($I_1$, $I_2$) and at least one current detection device downstream of the activation arrangement (7), wherein the at least one current detection device (9) is connected to at least one component of the field device (1) to be grounded and/or shielded.

In another preferred embodiment, the field device (1) as described herein, wherein the at least one component is a component to be connected with a protective conductor (11) and/or a grounding conductor (13), in particular a measuring electronic circuit and/or a housing (4) and/or a fastening arrangement (17) of the field device (1).

In another preferred embodiment, the field device (1) as described herein, wherein respectively one current detection device (9) each is connected to respectively one component.

In another preferred embodiment, the field device (1) as described herein, wherein the at least one current detection device (9) is connected to a computing unit (14).

In another preferred embodiment, the field device (1) as described herein, wherein the monitoring device (3) is connected to a display unit (2).

In another preferred embodiment, the field device (1) as described herein, wherein the monitoring device (3) has a memory (15) for storing a value for the monitored currents ($I_1$, $I_2$).

In another preferred embodiment, a method for operating a field device (1) with a monitoring device (3) for grounding and shield connections according to any of the preceding claims, characterized in that the activation arrangement (7) of the monitoring device (3) performs a monitoring process at least upon startup of the field device (1) by sending a monitoring current ($I_1$, $I_2$) and by measuring the current by means of the at least one current detection device (9), and by generating a warning message if the current reading is too low.

In another preferred embodiment, the method for operating a field device described herein, wherein the activation arrangement (7) performs the monitoring process cyclically after startup.

In another preferred embodiment, the method for operating a field device described herein, wherein the currents measured during the monitoring process are stored, and in that the currents measured during a subsequent monitoring process are compared to the stored currents, and in that a warning message is generated if the measured currents deviate from the stored currents by more than 10%.

DETAILED DESCRIPTION OF THE INVENTION

Figure 1:
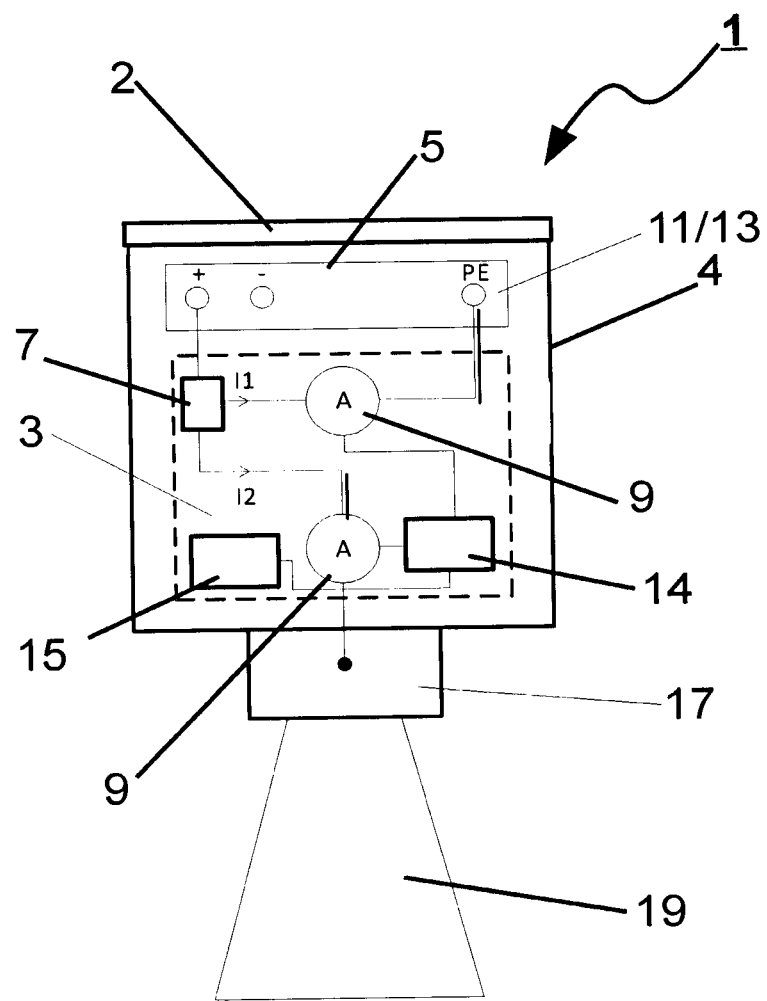
FIG. 1 is a line drawing evidencing a simplified representation of a block diagram of a field device according to the present patent application.

A In a field device according to the invention with a monitoring device for grounding and/or shield connections in which the monitoring device has a power supply of the field device, and which comprises an activation arrangement for activating a monitoring current and at least one current detection device downstream of the activation arrangement, the at least one current detection device is connected to at least one component of the field device to be grounded and/or to be shielded.

A corresponding monitoring device can then feed a monitoring current to the components of the field device to be grounded and/or to be shielded and can therefore determine whether grounding and/or shielding has been reliably achieved. For example, if grounding is not, or only insufficiently, achieved the monitoring current fed by the monitoring device cannot flow to ground. This is detected and can be displayed accordingly by the current detection system, which is connected between the activation arrangement for feed-in of the monitoring current and the component to be monitored.

The at least one component can in particular be a component to be connected with a protective conductor/or a grounding conductor, in particular a measuring electronic circuit and/or a housing and/or a mounting arrangement of the field device. These components are also referred to below as components to be monitored. For all of the aforementioned components, it may be necessary to shield and/or ground these in order to ensure reliable/safe measurement, i.e. reliability of the measured values and/or device safety, i.e., in particular safety for persons operating the device.

An electromagnetic shield or shielding has the task to either contain an electromagnetic field generated in the interior of the shield and to prevent it from propagating or to create a space free of externally acting fields.

A protective conductor is an electrical conductor for the purpose of safety, for example protection against electrical shock. In the case of a short-circuit of an active (live) conductor with a conductive, touchable part (e.g., the housing), the protective measure "protective ground" on electrotechnical systems keeps the former at ground potential and thus prevents, or at least reduces, current flow through the (human) body against ground.

A grounding conductor creates the connection with ground potential; many protective conductors are designed as grounding conductors.

Measuring reliability then in particular is defined as ensuring the integrity of the measured values. These can often be impaired by electromagnetic interference, so that a shield for certain components of the measuring electronic circuits of the measuring instrument and a correctly mounted shield of various connection lines is important for the signal transmission for optimized functionality of the field device. By connecting the shield to an internal or external mass potential, electromagnetic interference or voltages induced by these can be reliably diverted.

In order to guarantee device safety, components of the field device that can be touched by operating personnel, for example a housing, must also be connected to ground potential, so that voltages induced or otherwise occurring there are diverted to ground potential in order to prevent injury to operating personnel.

An attachment arrangement in particular is defined as a process connection of the field device by which the field device can be mechanically connected to a process environment.

In particular, respectively one current detection device can be connected to respectively one component to be monitored. A detected error can be then be unambiguously mapped based on such a one-to-one assignment between current detection devices and components to be monitored. Otherwise, although an error can be detected on the shield or grounding, a clear allocation is nevertheless not possible.

Alternatively, a monitoring current can also be routed sequentially to the various components to be monitored. For this, a switching device is necessary, which is connected downstream of the current measuring device and supplies the monitoring current to the various components, e.g. electrically connects these to the monitoring device.

The at least one current detection device can for example be connected to a computing unit. Such a computing unit can compare the recorded currents with, for example, stored reference values, or compare the recorded currents with currents stored from a previous measurement, so that changes in the recorded currents can be detected. Such changes can indicate a change to the component to be monitored, e.g. that a previously correctly positioned shield is e.g. no longer properly positioned or has come loose, or that a grounding contact for example has an increased contact resistance, which could lead to a problem.

In the simplest case, a comparator can be used as such a computing unit, which compares the determined current or a corresponding voltage with a reference current or a reference voltage. Typically, if the functionality of the monitoring system is to be implemented independently of any remaining electronics, ASICs or micro-controllers are used to carry out this task. Alternatively, however, a microcontroller already present on the field device, which is used for example to analyze measured values, can be used for monitoring the shielding and earthing connections.

If the monitoring device is connected to a display unit, a warning or error message can be displayed visually, so that a user is directly informed of a missing shield or grounding when the field device is placed into service. Such a display unit can be an alphanumeric display, but can also be realized by LEDs for example in the manner of a traffic light circuit. In this embodiment, a green LED would then be a fault-free state, a yellow illuminated LED would be a warning, and a red LED would indicate an error state. Alternatively, or in addition, the absence of a shield or grounding connection can be transmitted by a radio interface to a superordinate unit or an operating unit and displayed there. Transmission on various bus systems or a fault mode according to the 4-20 mA standard is also possible.

The monitoring device can additionally have a memory for storing a value for the monitored currents. A memory can e.g. be used to store and compare a plurality of currents determined for respectively one component to be monitored. This permits, e.g. performing trend analyses, and a degrading contact of the shield or the grounding can be detected early.

A method according to the invention for operating a field device with a monitoring device for grounding and shield connections is characterized in that the activation arrangement of the monitoring device carries out a monitoring process at least when or after the field device is placed into service by sending a monitoring current and by measuring the current with the at least one current detection device, and by generating a warning message when the current reading is too low.

In this way, a test performed when the field device is placed into service determines whether the grounding and shield connections relevant for the field device are sufficiently well contacted to ensure measurement reliability and device safety. A warning message can also achieve that grounding and shield connections are detected that do not directly lead to a function error, but might cause an error at a later point in time. This can, for example, be the case when e. g. engines or frequency converters in the environment are not active at startup. Cyclical problems caused by EMC and missing shielding connections would subsequently occur if these components are in operation.

After startup of the field device, the activation arrangement can execute the monitoring process cyclically, i.e. in regular intervals. This permits changes to be detected to the grounding and/or shielding of the components to be monitored and errors due to the absence thereof to be prevented early.

This can be achieved, for example, by storing the currents measured during the monitoring process and then comparing the measured currents with the stored currents in a subsequent monitoring process, and by then generating a warning message if the measured currents deviate from the stored currents by more than 10%. Alternatively, or in addition, the absence of a shield or grounding connection can be transmitted by a radio interface to a superordinate unit or an operating unit and displayed there. Transmission on various bus systems or a fault mode according to the 4-20 mA standard is also possible.

DETAILED DESCRIPTION OF THE FIGURES

FIG. 1 shows a simplified block diagram of a first exemplary embodiment of a field device 1 with a monitoring device 3 for protective conductors 11 and grounding conductors 13.

For sake of clarity, the field device 1 is only shown schematically in the exemplary embodiment shown in FIG. 1. The field device 1 shown in FIG. 1 is a radar fill level measuring device, which in the example here is designed with a housing 4, a fastening arrangement 17 formed on the front of housing 4 as a process connection, as well as an antenna 19 oriented to the process for transmitting the radar signals. The field device 1 furthermore comprises a display unit 2 for displaying the measured values and possible warning messages of a monitoring device 3 according to the present patent application. For better clarity, an electronic measurement circuit for measurement value processing is not shown in the present illustration of FIG. 1.

In the exemplary embodiment shown, the field device 1 comprises a monitoring device 3 in housing 4 for monitoring the protective conductor 11 and grounding conductor 13. The monitoring device 3 is connected to a power supply 5 of the field device 1 and comprises an activation arrangement 7, which is formed to send a first monitoring current I1 and a second monitoring current I2. The activation arrangement 7 is connected in the present exemplary embodiment with a first output by interconnecting a current detection device 9 with a protective conductor 11, a so-called PE conductor. A second output of the activation arrangement 7 is also connected in the present exemplary embodiment by interconnecting a current detection device 9 to the fastening arrangement 17 of the field device 1. By sending the mandatory monitoring currents I1, I2, a test performed in this manner can determine whether the protective conductor 11 is connected to an internal or external mass contact and whether the fastening arrangement 17 is connected to a grounding conductor. Only when these connections are reliably made can the monitoring currents I1, I2 sent by the activation arrangement 11 flow through the protective conductor 11 or the grounding conductor 13, so that a current can be recorded by the current detection devices 9.

The current detection devices 9 are connected in the present exemplary embodiment with a computing unit 14, which compares the measured currents with reference values stored in a memory 15, which is likewise connected to the computing unit 14, and with currents measured in previously performed measurements. By comparing the measured currents with reference values, in the event that the measured current is below the reference value it can be determined whether the protective conductor 11 or grounding conductor 13 is not, or not properly, connected, and based thereon a warning message can be displayed on a display unit 2 connected with the monitoring device 3. By comparing the measured currents with the values measured from previous measurements, a trend can be calculated across several measurements, so that, for example, corrosion of connections and a resulting contact resistance can be detected.

Figure 2:
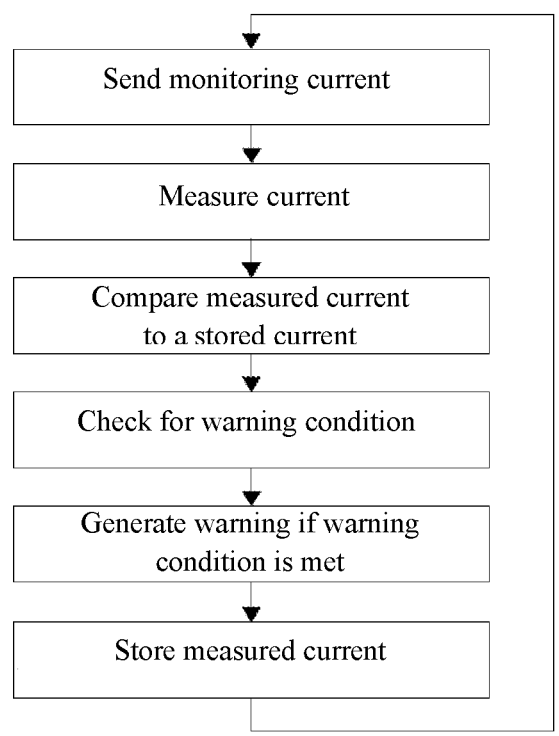
FIG. 2 is a flow chart evidencing a possible procedure for a method for monitoring grounding and shield connections according to the present patent application.

FIG. 2 shows a possible process of a method for monitoring grounding and shield connections according to the present patent application.

The present method can therefore also check for shielding connections, i.e. whether the shield of a connection cable is connected to a mass connection.

As shown in FIG. 1, the monitoring device 3 first sends monitoring currents I1, I2 to monitor the grounding and shield connections. This is triggered in the exemplary embodiment shown in FIG. 1 by the activation arrangement 7. An actual current flowing to the protective conductor 11 and the fastening arrangement 17 is then measured by the current detection devices 9, and subsequently compared to a reference value. As shown in the exemplary embodiment of FIG. 1, said reference value can be stored in the memory 15 or generated as an analog value. After the comparison, a warning condition is checked and a warning is issued when the warning condition is met. The warning condition can for example be that the measured current falls below the reference value by more than 10%. Additionally, the measured current can be stored in order to be able to determine changes over several measured values. The specified value can vary depending on application and can be adjusted accordingly.

The process shown in FIG. 2 specifies that the test is performed continuously, i.e. a new test is performed after the test is completed. To conserve power, the test can only take place once when the field device 1 is placed into service, or cyclically at fixed intervals.

LIST OF REFERENCE NUMBERS

1 Field device
2 Display unit
3 Monitoring device
4 Housing
5 Power supply
7 Activation arrangement
9 Current detection device
11 Protective conductor
13 Grounding conductor
14 Computing unit
15 Memory
17 Mounting arrangement/process connection
19 Antenna
$I_1$ First monitoring current
$I_2$ Second monitoring current The references recited herein are incorporated herein in their entirety, particularly as they relate to teaching the level of ordinary skill in this art and for any disclosure necessary for the commoner understanding of the subject matter of the claimed invention. It will be clear to a person of ordinary skill in the art that the above embodiments may be altered or that insubstantial changes may be made without departing from the scope of the invention. Accordingly, the scope of the invention is determined by the scope of the following claims and their equitable equivalents.

We claim:

1. A field device for measuring one or more of fill levels, limit levels and pressure levels, comprising a power supply, a housing and a monitoring device for grounding and/or shield connections, wherein the power supply and the monitoring device are arranged in the housing, the monitoring device is connected to the power supply and has an activation arrangement wherein a switching device sequentially supplies a monitoring current to each of a measuring electronic circuit of the field device, the housing, and a fastening arrangement of the field device, wherein each of the measuring electronic circuit, the housing and the fastening arrangement are connected to a respective current detection device for testing for proper grounding and/or shield connections.

2. The field device of claim 1, wherein each current detection device is connected to a computing unit.

3. The field device of claim 1, wherein the monitoring device is connected to a display unit.

4. The field device of claim 1, wherein the monitoring device comprises a memory for storing a value for the monitored currents.

5. A method for operating a field device comprising a monitoring device for grounding and shield connections according to claim 1, wherein the activation arrangement of the monitoring device performs a monitoring process at least upon startup of the field device by sequentially sending the monitoring current to each of the measuring electronic circuit of the field device, the housing, and the fastening arrangement of the field device and by measuring the current by means of the respective detection device, and by generating a warning message if any of the current readings are too low.

6. The method of claim 5, wherein the activation arrangement performs the monitoring process cyclically after startup.

7. The method of claim 6, wherein the currents measured during the monitoring process are stored, and in that the currents measured during a subsequent monitoring process are compared to the stored currents, and in that the warning message is generated if the measured currents deviate from the stored currents by more than 10%.

* * * * *